(12) United States Patent
Wuppermann

(10) Patent No.: US 6,784,746 B1
(45) Date of Patent: Aug. 31, 2004

(54) CIRCUIT AND METHOD FOR CORRECTING THERMAL DEVIATIONS OF ONE OR MORE OUTPUT SIGNALS FROM AN AMPLIFIER WITH EARLY EFFECT COMPENSATION

(75) Inventor: Bernd Wuppermann, Pacifica, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/418,383

(22) Filed: Apr. 17, 2003

(51) Int. Cl.[7] .............................. H03F 3/04; H03F 3/45
(52) U.S. Cl. ..................................... 330/289; 330/256
(58) Field of Search ................................ 330/289, 256, 330/266, 272

(56) References Cited

U.S. PATENT DOCUMENTS

| | | | |
|---|---|---|---|
| 4,555,675 A | * 11/1985 | Blanchandin et al. | ....... 330/289 |
| 4,749,889 A | * 6/1988 | Lagoni et al. | ............... 327/513 |
| 5,483,199 A | 1/1996 | Knudsen | |
| 5,576,662 A | * 11/1996 | Price et al. | .................. 330/277 |
| 5,783,970 A | * 7/1998 | Pleitz | .......................... 330/269 |
| 6,677,823 B2 | * 1/2004 | Terosky et al. | ............. 330/289 |

* cited by examiner

Primary Examiner—Patricia Nguyen

(57) ABSTRACT

A circuit and method for correcting thermal deviations of one or more output signals from an amplifier utilizes Early effect-compensated correcting signals to reduce the thermal deviations of the output signals. The correcting signals are derived from temperature-dependent signals, which correspond to the thermal deviations of the output signal. The temperature-dependent signals, however, include errors due to Early effect. The Early effect errors are compensated in the correcting signals by introducing reverse Early effect errors into the correcting signals. Consequently, the compensating signals can be used to more effectively correct the thermal deviations of the output signals.

22 Claims, 3 Drawing Sheets

CIRCUIT AND METHOD FOR CORRECTING THERMAL DEVIATIONS OF ONE OR MORE OUTPUT SIGNALS FROM AN AMPLIFIER WITH EARLY EFFECT COMPENSATION

FIELD OF THE INVENTION

The invention relates generally to circuits, and more particularly to a circuit and method for correcting thermal deviations of an output signal from an amplifier.

BACKGROUND OF THE INVENTION

Signal dependent changes in the temperature of "signal" transistors in an amplifier can cause gain changes or thermal deviations, which are reflected in the output signal of the amplifier over time in the form of a "thermal tail". "Signal" transistors are transistors on the signal path of the amplifier. A thermal tail is part of an amplified signal that deviates from a defined level over time due to the temperature changes of the amplifier signal transistors. Consequently, in response to an input step signal, an amplifier may produce an output signal that seems to settle within a few hundred picoseconds but instead continues to slowly change toward a final value over several milliseconds. This is particularly problematic if the amplifier is used in oscilloscopes where step settling can easily be observed over many decades of sweeps. Typically, a thermal tail correcting circuit is used to correct thermal deviations of an output signal from an amplifier.

A conventional thermal tail correcting circuit operates to generate an offset signal, which corresponds to the gain changes due to temperature changes of signal transistors in an amplifier. The offset signal is generated using one or more active devices that are similar to the signal transistors in the amplifier. Using the output signal of the amplifier, the active devices of the thermal tail correcting circuit are operated under similar conditions as the signal transistors in the amplifier to correspondingly change the temperatures of the active devices. In the case in which the active devices are bipolar transistors, changes in the power dissipation of the active devices will lead to temperature changes, which are reflected in the base-emitter voltages. Thus, the base-emitter voltages can be used to generate the offset signal.

A concern with a conventional thermal tail correcting circuit that uses bipolar transistors as the active devices is the introduction of base-width variations known as "Early effect" in the bipolar transistors, which also changes the base-emitter voltages. Thus, the offset signal generated by the thermal tail correcting circuit is corrupted by the Early effect in the active devices, which can lead to degradation in the step response of an amplifier.

In light of this concern, what is needed is a circuit and method for correcting thermal deviations of an output signal from an amplifier with Early effect compensation.

SUMMARY OF THE INVENTION

A circuit and method for correcting thermal deviations of one or more output signals from an amplifier utilizes Early effect-compensated correcting signals to reduce the thermal deviations of the output signals. The correcting signals are derived from temperature-dependent signals, which correspond to the thermal deviations of the output signal. The temperature-dependent signals, however, include errors due to Early effect. The Early effect errors are compensated in the correcting signals by introducing reverse Early effect errors into the correcting signals. Consequently, the compensating signals can be used to more effectively correct the thermal deviations of the output signals.

A circuit for correcting thermal deviations of an output signal in accordance with one embodiment of the invention includes a thermal sensing unit and an error compensating unit. The thermal sensing unit includes a first transistor that is connected between a first high voltage terminal and a first low voltage terminal to generate a temperature-dependent signal in response to a first input signal. The first temperature-dependent signal includes an error caused by a voltage change induced by an effective base width variation of the first transistor, e.g., Early effect errors, in responding to the first input signal. The error compensating unit includes a second transistor that is connected between a second high voltage terminal and a second low voltage terminal to generate a correcting signal using the temperature-dependent signal. The second transistor is further connected to be responsive to an inverse signal of the first input signal to introduce a reverse error, e.g., a reverse Early effect error, into the correcting signal to compensate the effects of the error on the correcting signal. The correcting signal corresponds to the thermal deviations of the output signal. Thus, the correcting signal can be used to reduce the thermal deviations of the output signal.

A method for correcting thermal deviations of an output signal in accordance with one embodiment of the invention includes receiving a first input signal and a reverse signal of the first input signal, generating a temperature-dependent signal in response to the first input signal using a first transistor, generating a correcting signal in response to the temperature-dependent signal using a second transistor, and reducing the thermal deviations of the output signal using the correcting signal. The temperature-dependent signal includes an error caused by a voltage change induced by an effective base width variation of the first transistor, e.g., an Early effect error, in responding to the first input signal. The generating of the correcting signal includes operating the second transistor to be responsive to the inverse signal to introduce a reverse error, e.g., a reverse Early effect error, into the correcting signal to compensate the effects of the error on the correcting signal.

Other aspects and advantages of the present invention will become apparent from the following detailed description, taken in conjunction with the accompanying drawings, illustrated by way of example of the principles of the invention.

DETAILED DESCRIPTION

Figure 1:
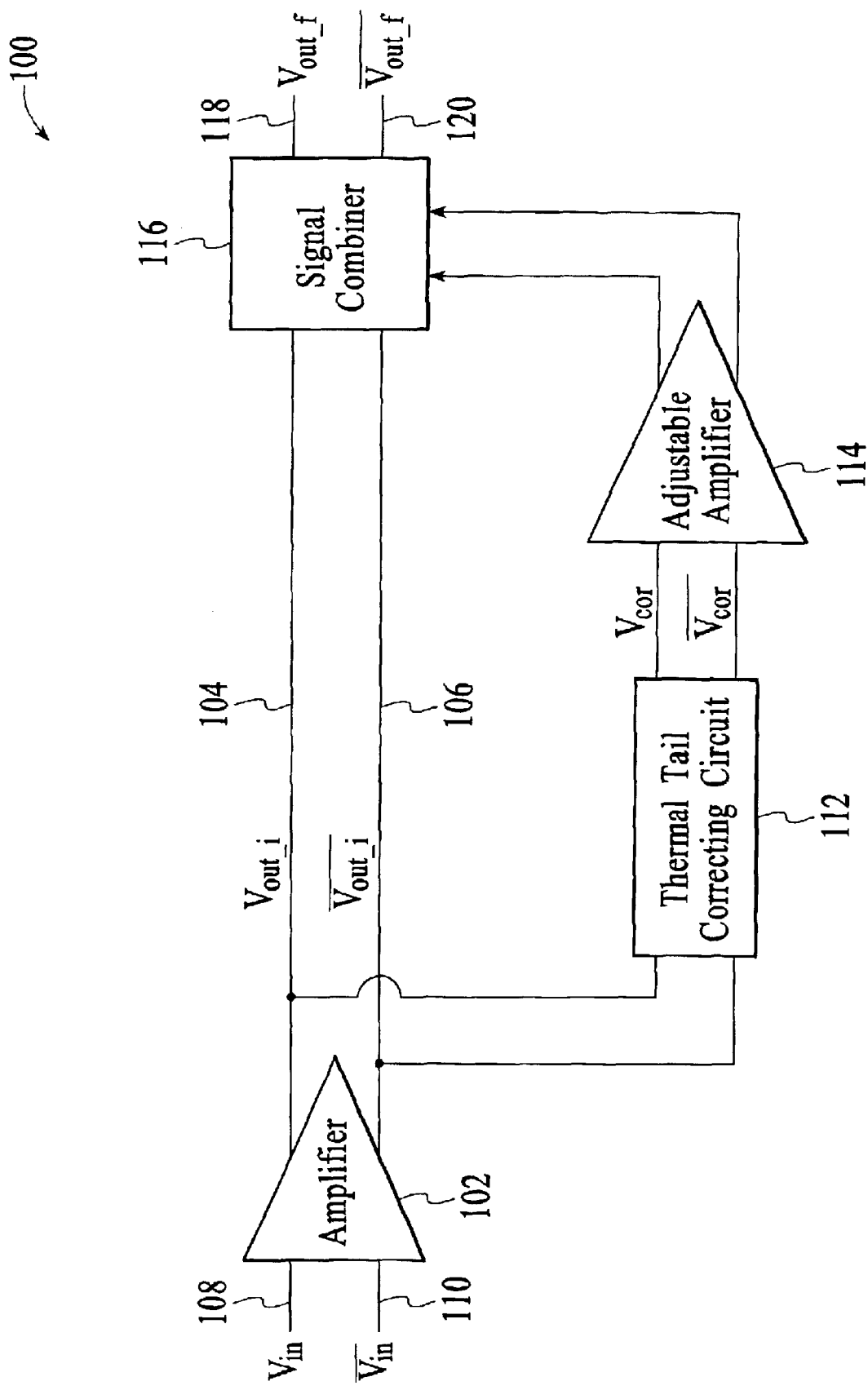
FIG. 1 is a diagram of a system for generating high gain differential output signals with thermal tail correction.

With reference to FIG. 1, a system 100 for generating high gain differential output signals with thermal tail correction is shown. The system 100 includes an amplifier 102 that generates differential output signals $V_{out\_i}$ and $\overline{V_{out+di\_i}}$ on output terminals 104 and 106 in response to input signals $V_{in}$ and $\overline{V_{in}}$ received on input terminals 108 and 110. As an example, the amplifier 102 may be a wide band amplifier commonly found in oscilloscopes. Since the output signals are differential signals, when one of the output signals is "high", the other differential signal is "low". The system 100 also includes a thermal tail correcting circuit 112 in accordance with the invention, which is connected to the output terminals 104 and 106 to receive the differential output signals of the amplifier 102. As described below, the thermal tail correcting circuit 112 operates to generate differential correcting signals $V_{cor}$ and $\overline{V_{cor}}$ that can be used to reduce or eliminate thermal deviations of the output differential signals, i.e., "thermal tails", caused by temperature changes of signal transistors in the amplifier 102 without introducing errors caused by Early effect.

The system 100 further includes an adjustable amplifier 114 and a signal combiner 116. The adjustable amplifier 114 operates to amplify the differential correcting signals $V_{cor}$ and $\overline{V_{cor}}$ from the thermal tail correcting circuit 112. The correcting signals correspond to the thermal deviations of the output signals $V_{out\_i}$ and $\overline{V_{out+di\_i}}$ on the output terminals 104 and 106 caused by the temperature changes of the signal transistors in the amplifier 102. Preferably, the amplification provided by the adjustable amplifier 114 is adjusted to a setting, which can be empirically determined, such that the amplified differential correcting signals will properly correct the thermal deviations of the differential output signals. The signal combiner 116 operates to combine the output signals on the output terminals 104 and 106 with offset signals, i.e., the amplified correcting signals from the adjustable amplifier 114, to reduce or eliminate the thermal deviations of the output signals. Thus, the outputs of the signal combiner 116 are thermal tail corrected output signals $V_{out\_f}$ and $\overline{V_{out+di\_f}}$ on output terminals 118 and 120.

In an alternative configuration, the signal combiner 116 may be connected to the input terminals 108 and 110. In this configuration, the signal combiner 116 operates to combine the offset signals from the adjustable amplifier 114 with the corresponding input signals $V_{in}$ and $\overline{V_{in}}$ to adjust the input signals of the amplifier 102 to reduce or eliminate the thermal deviations of the output signals $V_{out\_i}$ and $\overline{V_{out+di\_i}}$ from the amplifier, which are also inputs for the thermal tail correcting circuit 112.

Although not illustrated in FIG. 1, the system 100 may include one or more low pass filters to suppress high frequency components that could otherwise add noise and/or cause instability of the amplifier 102. As an example, a first low pass filter can be located between the amplifier 102 and the thermal tail correcting circuit 112 and a second low pass filter can be located between the adjustable amplifier 114 and the signal combiner 116.

Figure 2:
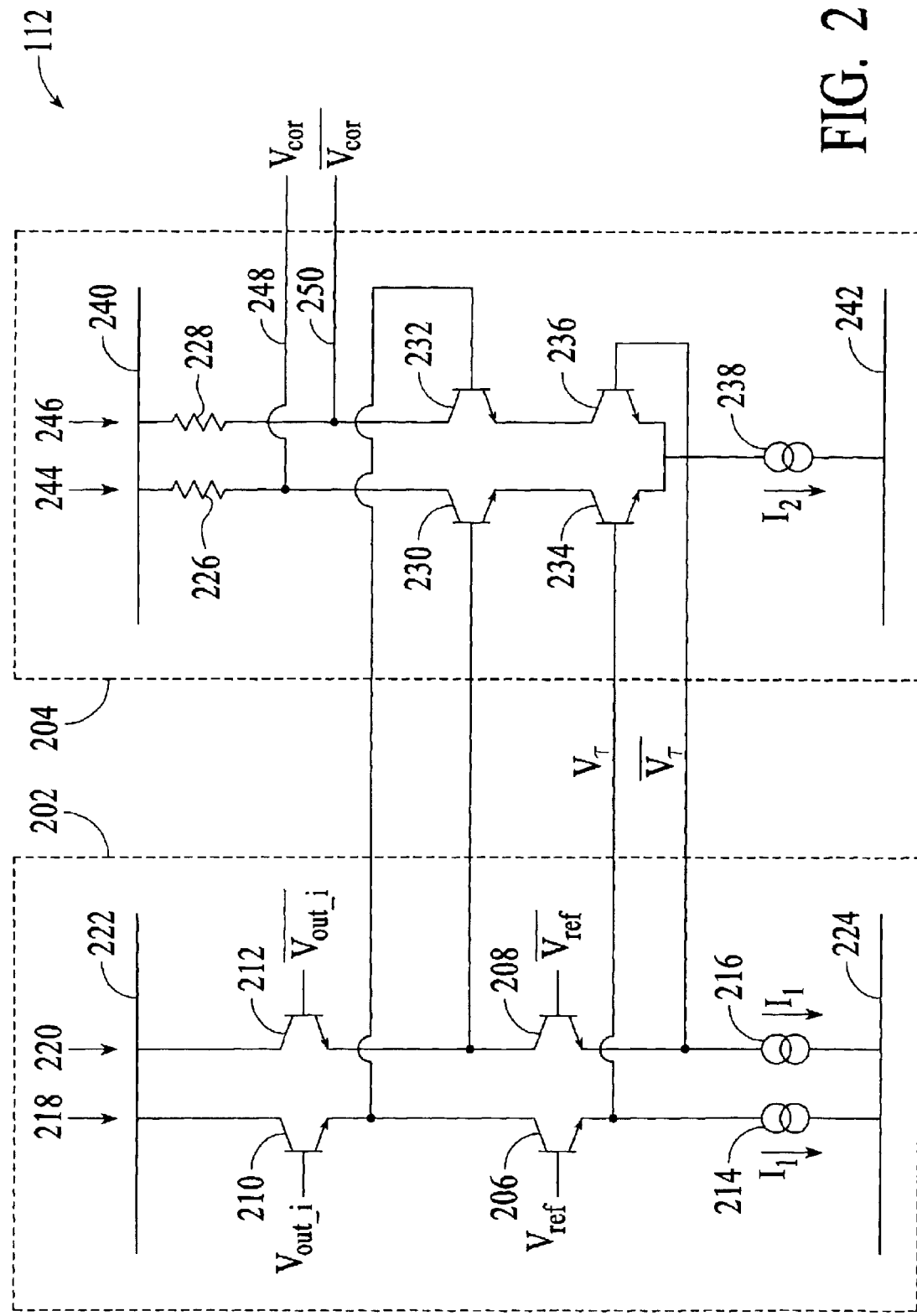
FIG. 2 is a circuit diagram of a thermal tail correcting circuit that can be used in the system of FIG. 1 in accordance with one embodiment of the invention.

Turning now to FIG. 2, the thermal tail correcting circuit 112 in accordance with one embodiment of the invention is shown. The thermal tail correcting circuit 112 includes a thermal sensing unit 202 and an Early effect compensator 204. The thermal sensing unit 202 is connected to the output terminals 104 and 106, as shown in FIG. 1, to receive the differential output signals $V_{out\_i}$ and $\overline{V_{out+di\_i}}$ from the amplifier 102. The thermal sensing unit 202 operates to generate temperature-dependent signals $V_t$ and $\overline{V_t}$ in response to the received output signals using transistors 206 and 208. The temperature-dependent signals reflect the temperatures of the transistors 206 and 208. The transistors 206 and 208 are structurally similar to the signal transistors of the amplifier 102 that cause the thermal deviations of the output signals on the output terminal 104 and 106. Thus, changes in the temperature-dependent signals correspond to the thermal deviations of the output signals on the output terminals of the amplifier 102 due to temperature changes of the signal transistors of the amplifier. Consequently, the temperature-dependent signals can be used to correct the thermal deviations of the output signals. Unfortunately, the temperature-dependent signals include errors caused by Early effect in transistors 206 and 208 of the thermal sensing unit 202 that generate the temperature-dependent signals. The Early effect compensator 204 operates to amplify the temperature-dependent signals to generate differential correcting signals $V_{cor}$ and $\overline{V_{cor}}$. In addition, the Early effect compensator 204 operates to introduce reverse Early effect errors into the differential correcting signals, as described below, such that the effects of the Early effect errors on the differential correcting signals are removed. Thus, the differential correcting signals can be used for effective thermal tail correction of the differential output signals from the amplifier 102.

As shown in FIG. 2, the thermal sensing unit 202 includes the bipolar transistors 206 and 208, bipolar transistors 210 and 212, and current sources 214 and 216 on two parallel current paths 218 and 220, which are connected between a high voltage terminal 222, e.g., a supply voltage terminal, and a low voltage terminal 224, e.g., ground. The bipolar transistors 206 and 210 and the current source 214 are connected in series between the high and low voltage terminals 222 and 224 on the current path 218. The collector of the transistor 210 is connected to the high voltage terminal 222, while the emitter of the transistor 210 is connected to the collector of the transistor 206. The base of the transistor 210 is connected to the output terminal 104 to receive the output signal $V_{out\_i}$. The emitter of the transistor 206 is connected to the current source 214, which is connected to the low voltage terminal 224. The base of the transistor 206 is connected to receive a reference voltage $V_{ref}$. Similarly, the bipolar transistors 208 and 212 and the current source 216 are connected in series between the high and low voltage terminals 222 and 224 on the current path 220. However, the base of the transistor 212 is connected to the output terminal 106 to receive the output signal $\overline{V_{out+di\_i}}$. As indicated in FIG. 2, the current sources 214 and 216 are configured to conduct the same current $I_1$.

Since the transistors 206 and 208 are cascoded with the transistors 210 and 212, respectively, the power dissipation in the transistors 206 and 208 depends on the output signals $V_{out\_i}$ and $\overline{V_{out+di\_i}}$, respectively, applied to the bases of the transistors 210 and 212. A "high" output signal applied to the cascode transistor 210 will increase the collector-emitter voltage of the cascoded transistor 206, which increases the power dissipation in the cascoded transistor 206. The increased power dissipation in the cascoded transistor 206 increases the temperature of the cascoded transistor 206, which decreases the base-emitter voltage of the cascoded transistor 206 due to the constant current $I_1$ provided by the current source 214. This change in the base-emitter voltage of the cascoded transistor 206 is manifested by a voltage change at the emitter of the cascoded transistor 206. The voltage at the emitter of the cascoded transistor 206 is referred to herein as the temperature-dependent signal $V_t$, while the voltage at the emitter of the cascoded transistor 208 is referred to herein as the temperature-dependent signal $\overline{V_t}$. The transistors 208 and 212 and the current source 216 on the current path 220 operate in the same manner as the transistors 206 and 210 and the current source 214 on the current path 218. Thus, the operation of the transistors 208 and 212 and the current source 216 on the current path 220 is not described herein.

Changes in the temperature-dependent signal $V_t$ correspond to the thermal deviations of the output signal $V_{out\_i}$ on the output terminal 104. Thus, the temperature-dependent signal $V_t$ can be used to correct the thermal deviations of the output signal $V_{out\_i}$. Similarly, changes in the temperature-dependent signal $\overline{V_t}$ correspond to the thermal deviations of the output signal $\overline{V_{out+di\_i}}$ on the output terminal 104. Thus, the temperature-dependent signal $\overline{V_t}$ can be used to correct the thermal deviations of the output signal $\overline{V_{out+di\_i}}$. However, as stated above, the temperature-dependent signals include errors induced by base-width variations of the transistors 206 and 208, i.e., Early effect, which cause changes in the base-emitter voltages of the transistors 206 and 208. These errors in the temperature-dependent signals due to the Early effect are compensated at the Early effect compensator 204 of the thermal tail correcting circuit 112, as described below.

The Early effect compensator 204 of the thermal tail correction circuit 114 includes resistors 226 and 228, bipolar transistors 230, 232, 234 and 236, and a current source 238, which are connected between a high voltage terminal 240, e.g., a supply voltage terminal, and a low voltage terminal 242, e.g., ground. The resistor 226 and the bipolar transistors 230 and 234 are connected in series on a current path 244 between the high voltage terminal 240 and the current source 238. The resistor 226 is connected between the high voltage terminal 240 and the collector of the transistor 230. The emitter of the transistor 230 is connected to the collector of the transistor 234, while the emitter of the transistor 234 is connected to the current source 238. Thus, the transistor 234 is cascoded with the transistor 230. The resistor 228 and the bipolar transistors 232 and 236 are similarly connected in series on a current path 246 between the high voltage terminal 240 and the current source 238, which is parallel to the current path 244.

The resistor 226 serves as a current-to-voltage converter to provide a differential correcting signal $V_{cor}$ on an output terminal 248, which is connected to the current path 244 between the resistor 226 and the cascode transistor 230. Likewise, the resistor 228 serves to provide a differential correcting signal $\overline{V_{cor}}$ on an output terminal 250, which is connected to the current path 246 between the resistor 228 and the cascode transistor 232.

The differential correcting signals $V_{cor}$ and $\overline{V_{cor}}$ on the output terminals 248 and 250 are determined by the operating conditions of the cascoded transistors 234 and 236, which are affected by the temperature-dependent signals $V_t$ and $\overline{V_t}$ applied to the bases of the transistors 234 and 236 and the voltages applied to the bases of the cascode transistors 230 and 232. A major portion of the differential correcting signal $V_{cor}$ is attributable to amplification of the temperature-dependent signal $V_t$ applied to the base of the transistor 234. The remaining portion of the differential correcting signal $V_{cor}$ is attributable to a signal change due to Early effect in the transistor 234, which is dependent on the voltage signal applied to the base of the transistor 230. Similarly, a major portion of the differential correcting signal $\overline{V_{cor}}$ is attributable to amplification of the temperature-dependent signal $\overline{V_t}$ applied to the base of the transistor 236, and the remaining portion of the differential correcting signal $\overline{V_{cor}}$ is attributable to a signal change due to Early effect in the transistor 236, which is dependent on the voltage signal applied to the base of the transistor 232.

However, the base of the transistor 234 is connected to the emitter of the transistor 206 on the current path 218 of the thermal sensing unit 202, while the base of the transistor 236 is connected to the emitter of the transistor 208 on the current path 220 of the thermal sensing unit. In addition, the base of the transistor 230 is connected to the emitter of the transistor 212 on the current path 220 of the thermal sensing unit 202, while the base of the transistor 232 is connected to the emitter of the transistor 210 on the other current path 218. Thus, the Early effect in the transistors 206 and 208 is similar to the Early effect in the transistors 236 and 234, respectively. Consequently, reverse Early effect errors are introduced into the differential correcting signals $V_{cor}$ and $\overline{V_{cor}}$ to compensate the effects of the Early effect errors of the temperature-dependent signals on the differential correcting signals. That is, the errors caused by the Early effect in the transistors 206 and 208 are negated by the reverse errors caused by the Early effect on the transistor 234 and 236 to produce Early effect-compensated correcting signals, which can be used to correct the thermal deviations of the output signals $V_{out\_i}$ and $\overline{V_{out+di\_i}}$.

The current source 238 is configured to conduct current $I_2$, as indicated in FIG. 2. Preferably, the current $I_2$ conducted through the current source 238 is very small in comparison with the currents $I_1$ conducted through the current sources 214 and 216. As an example, the difference between the currents $I_1$ and $I_2$ may be a factor of twenty. Under this condition, the power dissipation of the transistors 234 and 236 is significantly smaller than the power dissipation of the transistors 206 and 208, and thus, signal variations due to power dissipation changes in the transistors 234 and 236 are negligible in comparison with signal variations due to power dissipation changes in the transistors 206 and 208. Thus, only signal variations due to Early effect in the transistors 234 and 236 are introduced into the differential correcting signals $V_{cor}$ and $\overline{V_{cor}}$ at the Early effect compensator 204.

Although the thermal tail correcting circuit 112 has been described as being used to correct differential output signals, the thermal tail correcting circuit can also be used to correct a single-ended output signal. As an example, a single-ended output signal can be converted to differential signals using a single-ended to differential converter. The differential signals can then be used as input signals for the thermal tail correcting circuit. In this example, only one of the correcting signals $V_{cor}$ and $\overline{V_{cor}}$ generated by the thermal tail correcting circuit 112 is needed to correct for thermal deviations of the single-ended output signal.

Figure 3:
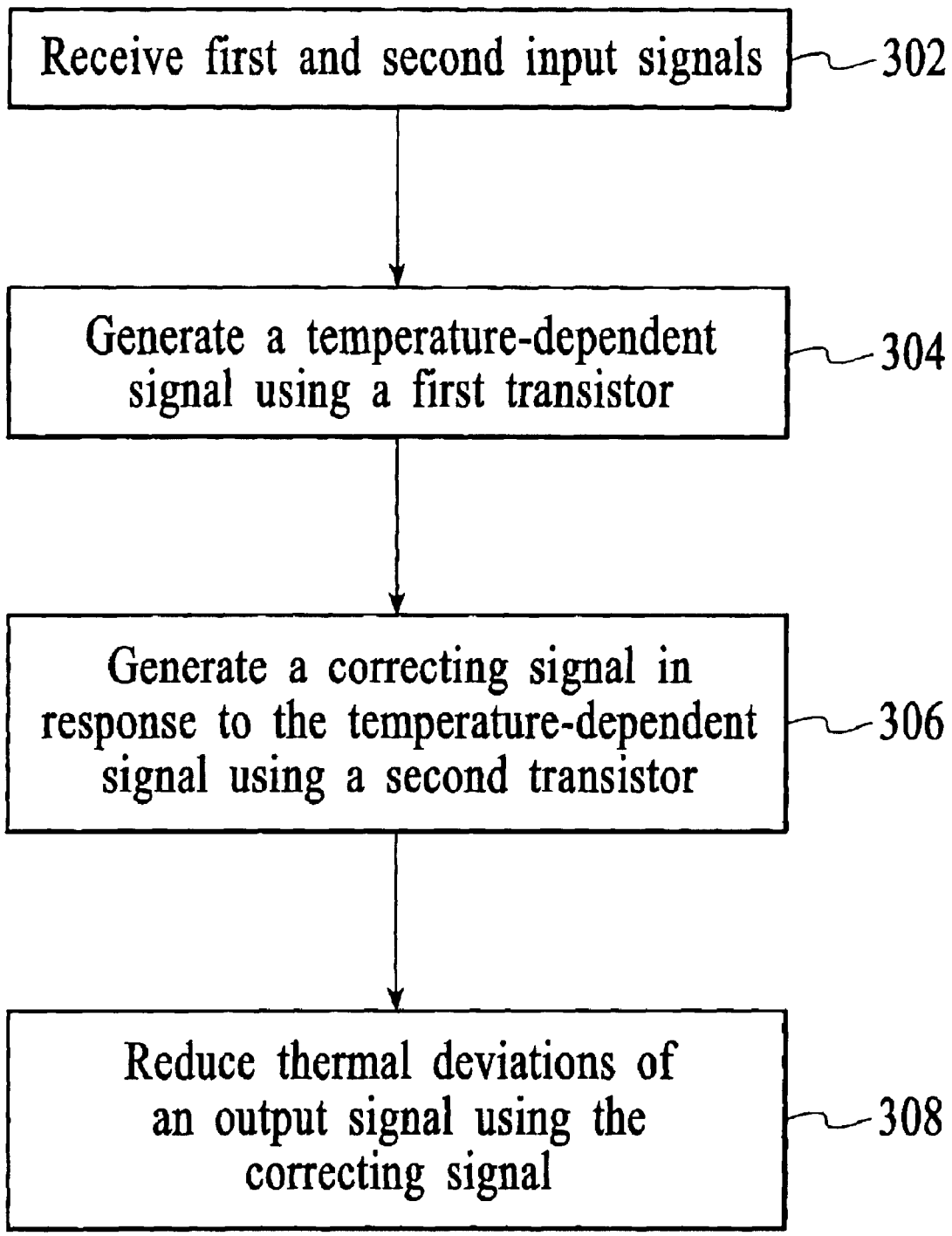
FIG. 3 is a flow diagram of a method of correcting thermal deviations of an output signal from an amplifier in accordance with one embodiment of the invention.

A method of correcting thermal deviations of an output signal in accordance with one embodiment of the invention is described with reference to a flow diagram of FIG. 3. At block 302, first and second input signals are received. As an example, the first and second input signals may be differential output signals from an amplifier. Next, at block 304, a temperature-dependent signal is generated in response to the first input signal using a first transistor. The temperature-dependent signal depends on the temperature of the first transistor, which corresponds to the thermal deviations of the output signal. At block 306, a correcting signal is generated in response to the temperature-dependent signal using a second transistor. In addition, at block 306, the second transistor is operated to be responsive to the second input signal to introduce a reverse Early effect error into the correcting signal to compensate the effects of the Early effect error of the temperature-dependent signal on the correcting signal. Next, at block 308, the thermal deviations of the output signal are reduced using the correcting signal. As an example, the thermal deviations of the output signal can be reduced by combining the correcting signal with the output signal.

Although specific embodiments of the invention have been described and illustrated, the invention is not to be limited to the specific forms or arrangements of parts so described and illustrated. As an example, the thermal tail correcting circuit 112 may be configured to include additional compensating transistors in the Early effect compensator 204 to compensate for Early effect in additional thermal sensing transistors in the thermal sensing unit 202. The scope of the invention is to be defined by the claims appended hereto and their equivalents.

What is claimed is:

1. A circuit for correcting thermal deviations of an output signal comprising:

a thermal sensing unit including a first transistor that is connected to generate a temperature-dependent signal in response to a first input signal, said temperature-dependent signal including an error caused by a voltage change induced by an effective base width variation of said first transistor in responding to said first input signal; and an error compensating unit connected to said thermal sensing unit, said error compensating unit including a second transistor that is connected to generate a correcting signal in response to said temperature-dependent signal, said second transistor being further connected to be responsive to an inverse signal of said first input signal to introduce a reverse error into said correcting signal to compensate effects of said error on said correcting signal, said correcting signal corresponding to said thermal deviations of said output signal such that said correcting signal can be used to reduce said thermal deviations of said output signal.

2. The circuit of claim 1 wherein said thermal sensing unit includes a first current source connected to said first transistor and wherein said error compensating unit includes a second current source connected to said second transistor, said first and second current sources being configured such that current conducted through said second current source is smaller than current conducted through said first current source.

3. The circuit of claim 1 wherein said thermal sensing unit further includes a first cascode transistor connected in series with said first transistor between a first high voltage terminal and a first low voltage terminal, said first cascode transistor being connected to receive said first input signal, and wherein said thermal sensing unit further includes a second cascode transistor connected in series with said second transistor between a second high voltage terminal and a second low voltage terminal, said second cascode transistor being connected to be responsive to said inverse signal.

4. The circuit of claim 1 wherein said thermal sensing unit includes a third transistor that is connected to generate a second temperature-dependent signal in response to said inverse signal, said second temperature-dependent signal including a second error caused by a voltage change induced by an effective base width variation of said third transistor in responding to said inverse signal, and wherein said error compensating unit includes a fourth transistor that is connected to generate a second correcting signal in response to said second temperature-dependent signal, said fourth transistor being further connected to be responsive to said first input signal to introduce a second reverse error into said second correcting signal to compensate effects of said second error on said second correcting signal.

5. The circuit of claim 4 wherein said thermal sensing unit further includes first and third cascode transistors connected in series with said first and third transistors, respectively, between a first high voltage terminal and a first low voltage terminal, said first and third cascode transistors being connected to receive said first input and inverse signals, and wherein said error compensating unit further includes second and fourth cascode transistors connected in series with said second and fourth transistors, respectively, between a second high voltage terminal and a second low voltage terminal, said second and fourth cascode transistors being connected to said first and third cascode transistors such that said second and fourth cascode transistors are responsive to said input and inverse signals.

6. The circuit of claim 5 wherein said first transistor is connected to a control electrode of said second transistor, said third transistor is connected to a control electrode of said fourth transistor, said first cascode transistor is connected to a control electrode of said fourth cascode transistor, and said third cascode transistor is connected to a control electrode of said second cascode transistor.

7. The circuit of claim 1 wherein said first and second transistors are bipolar transistors.

8. The circuit of claim 1 wherein one of said first input and inverse signals is derived from said output signal.

9. A circuit for correcting thermal deviations of an output signal comprising:

a first transistor connected between a first high voltage terminal and a first low voltage terminal, said first transistor being connected to be responsive to a first input signal to produce a temperature-dependent signal, said temperature-dependent signal including an error caused by a voltage change induced by an effective base width variation of said first transistor in responding to said first input signal; and a second transistor connected between a second high voltage terminal and a second low voltage terminal, said second transistor being connected to generate a correcting signal in response to said temperature-dependent signal, said second transistor being further connected to be responsive to an inverse signal of said first input signal to introduce a reverse error into said correcting signal to compensate effects of said error on said correcting signal, said correcting signal corresponding to said thermal deviations of said output signal such that said first correcting signal can be used to reduce said thermal deviations of said output signal.

10. The circuit of claim 9 further comprising first and second current sources, said first current source being connected in series with said first transistor, said second current source being connected in series with said second transistor, said first and second current sources being configured such that current conducted through said second current source is smaller than current conducted through said first current source.

11. The circuit of claim 9 further comprising first and second cascode transistors, said first cascode transistor being connected in series with said first transistor, said second cascode transistor being connected in series with said second transistor, said first cascode transistor being further connected to receive said first input signal, said second cascode transistor being further connected to be responsive to said inverse signal.

12. The circuit of claim 9 further comprising third and fourth transistors, said third transistor being connected in parallel with said first transistor between said first high voltage terminal and said first low voltage terminal to generate a second temperature-dependent signal in response to said inverse signal, said second temperature-dependent signal including a second error caused by a voltage change induced by an effective base width variation of said second transistor in responding to said inverse signal, said fourth transistor being connected in parallel with said second transistor between said second high voltage terminal and said second low voltage terminal to generate a second correcting signal in response to said second temperature-dependent signal, said fourth transistor being further connected to be responsive to said first input signal to introduce a second reverse error into said second correcting signal to compensate effects of said second error on said second correcting signal.

13. The circuit of claim 12 further comprising first, second, third and fourth cascode transistors, said first and third cascode transistors being connected in series with said first and third transistors, respectively, between said first high voltage terminal and said first low voltage terminal, said first and third cascode transistors being further connected to receive said first input and inverse signals, said second and fourth cascode transistors being connected in series with said second and fourth transistors, respectively, between said second high voltage terminal and said second low voltage terminal, said second and fourth cascode transistors being connected to said first and third cascode transistors such that said second and fourth cascode transistors are responsive to said first input and inverse signals.

14. The circuit of claim 13 wherein said first transistor is connected to a control electrode of said second transistor, said third transistor is connected to a control electrode of said fourth transistor, said first cascode transistor is connected to a control electrode of said fourth cascode transistor, and said third cascode transistor is connected to a control electrode of said second cascode transistor.

15. The circuit of claim 9 wherein said first and second transistors are bipolar transistors.

16. The circuit of claim 9 wherein one of said first input and inverse signals is derived from said output signal.

17. A method for correcting thermal deviations of an output signal comprising:

receiving a first input signal and an inverse signal of said first input signal;

generating a temperature-dependent signal in response to said first input signal using a first transistor, said temperature-dependent signal including an error caused by a voltage change induced by an effective base width variation of said first transistor in responding to said first input signal;

generating a correcting signal in response to said temperature-dependent signal using a second transistor, including operating said second transistor to be responsive to said inverse signal to introduce a reverse error into said correcting signal to compensate effects of said error on said correcting signal; and reducing said thermal deviations of said output signal using said correcting signal.

18. The method of claim 17 wherein said generating of said temperature-dependent signal includes subjecting said first transistor to a first current, and wherein said generating of said correcting signal includes subjecting said second transistor to a second current, said second current being smaller than said first current.

19. The method of claim 17 further comprising providing first and second cascode transistors, said first cascode transistor being connected in series with said first transistor, said second cascode transistor being connected in series with said second transistor, and wherein said generating of said temperature-dependent signal includes applying said first input signal to said first cascode transistor and said generating of said correcting signal includes operating said second cascode transistor to be responsive to said inverse signal.

20. The method of claim 17 further comprising:

generating a second temperature-dependent signals in response to said inverse signal using a third transistor, said second temperature-dependent signal including a second error caused by a voltage change induced by an effective base width variation of said third transistor in responding to said inverse signal;

generating a second correcting signal in response to said second temperature-dependent signal using a fourth transistor, including operating said fourth transistor to be responsive to said first input signal to introduce a second reverse error into said first correcting signal to compensate effects of said second error on said second correcting signal; and reducing thermal deviations of another output signal using said second correcting signal.

21. The method of claim 20 further comprising providing first, second, third and fourth cascode transistors connected in series with said first, second, third and fourth transistors, respectively, and wherein said generating of said temperature-dependent signal includes applying said first input signal to said first cascode transistor, said generating of said second temperature-dependent signal includes applying said inverse signal to said third cascode transistor, said generating of said correcting signal include applying a signal from said third cascode transistor to said second cascode transistor, and said generating of said second correcting signal includes applying a signal from said first cascode transistor to said fourth cascode transistor.

22. The method of claim 17 wherein one of said first input and inverse signals is derived from said output signal.

* * * * *